(12) United States Patent
Gratz et al.

(10) Patent No.: US 7,317,631 B2
(45) Date of Patent: Jan. 8, 2008

(54) METHOD FOR READING UNIFORM CHANNEL PROGRAM (UCP) FLASH MEMORY CELLS

(75) Inventors: Achim Gratz, Dresden (DE); Mayk Roehrich, Dresden (DE); Klaus Knobloch, Weixdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/213,670

(22) Filed: Aug. 26, 2005

(65) Prior Publication Data

US 2006/0039199 A1 Feb. 23, 2006

Related U.S. Application Data

(63) Continuation of application No. PCT/DE2004/000297, filed on Feb. 17, 2004.

(30) Foreign Application Priority Data

Feb. 27, 2003 (DE) ................. 103 08 856
Aug. 8, 2003 (DE) ................. 103 36 785

(51) Int. Cl.
*G11C 11/34* (2006.01)
(52) U.S. Cl. .............. 365/185.05; 365/185.11; 365/185.13; 365/185.26; 365/185.33
(58) Field of Classification Search ........... 365/185.05, 365/185.11, 185.13, 185.17, 185.18, 185.26, 365/185.27, 185.28, 185.29, 185.33; 257/316, 257/318
See application file for complete search history.

(56) References Cited

U.S. PATENT DOCUMENTS

| 5,339,279 | A | 8/1994 | Toms et al. |
| 5,508,956 | A | 4/1996 | Campardo et al. |
| 5,717,636 | A * | 2/1998 | Dallabora et al. ..... 365/185.11 |
| 5,748,530 | A | 5/1998 | Gotou et al. |
| 5,822,248 | A | 10/1998 | Satori et al. |
| 6,114,724 | A * | 9/2000 | Ratnakumar ........... 365/185.18 |
| 6,188,608 | B1 | 2/2001 | Maruyama et al. |
| 6,504,765 | B1 | 1/2003 | Joo |
| 6,628,544 | B2 * | 9/2003 | Shum et al. ........... 365/185.28 |
| 6,980,472 | B2 * | 12/2005 | Ditewig et al. ........ 365/185.18 |
| 7,042,044 | B2 * | 5/2006 | Wu ............................ 257/316 |

FOREIGN PATENT DOCUMENTS

| EP | 0 616 332 B1 | 6/1999 |
| EP | 1 091 359 A1 | 4/2001 |

OTHER PUBLICATIONS

Hayashikoshi, M., et al., "A Dual-Mode Sensing Scheme of Capacitor-Coupled EEPROM Cell," IEEE Journal of Solid-State Circuits, vol. 27, No. 4 (Apr. 1992) pp. 569-573.

* cited by examiner

*Primary Examiner*—Trong Phan
(74) *Attorney, Agent, or Firm*—Slater & Matsil, L.L.P.

(57) ABSTRACT

A flash memory cell can be read by selecting a local bit line. A read potential is applied to a memory cell transistor associated with the local bit line thereby generating a capacitive loading of the local bit line. The capacitive loading depends upon a magnitude of charge stored on a floating gate of the memory cell transistor. The capacitive loading of the local bit line can then be assessed to determine a state of the memory cell transistor, the state being related to the magnitude of the charge stored on the floating gate.

13 Claims, 2 Drawing Sheets

METHOD FOR READING UNIFORM CHANNEL PROGRAM (UCP) FLASH MEMORY CELLS

This application is a continuation of co-pending International Application No. PCT/DE2004/000297, filed Feb. 17, 2004, which designated the United States and was not published in English, and which is based on German Application No. 103 08 856.3, filed Feb. 27, 2003, and German Application No. 103 36 785.3, filed Aug. 8, 2003, all of which applications are incorporated herein by reference.

TECHNICAL FIELD

The present invention relates generally to semiconductor devices and in a particular embodiment to a method for the read-out of UCP (Uniform Channel Program) flash memory cells.

BACKGROUND

The requirements made of the development and provision of memory circuits are shaped by the continuous trend toward a higher storage density and toward higher write/read speeds in conjunction with a low energy consumption.

It is evident in the case of the prior art that hitherto innovations have successfully been made to a greater extent in the area of the technology of the memories, but have related less to the basic structure of the known standard memory cell.

In the case of the customary basic structure of the UCP flash memory cells, the contained digital information is retained by charged storage on a floating gate.

Thus, the floating gate of such a memory cell transistor is assigned to a word line via a control gate.

If the level of this signal line is at LOW, the memory transistors are not selected for write and read functions.

If, in the case where selection of the memory transistors is present, the read-out of a selected memory transistor that is occupied by a stored charge representing a HIGH level is implemented, a static read current flows through the channel formed between its drain and its source.

In the other case, upon read-out of a selected memory transistor that is occupied by a stored charge representing a LOW level, the channel is not formed between its drain and its source and no or a very small static read current flows.

In the case of the prior art, the read-out of the respective memory cell is affected at fixed potentials of the source and drain of the memory cell transistor. The source and drain terminals of the memory cell transistors are connected in parallel within a bit column via a respective bit line.

The two bit lines have contact-connections in order that these can be put at the necessary fixed potentials. In contrast to other memory concepts in which source lines of different bit columns can be put at a common potential, this is not possible in the case of the UCP memory concept.

This means that a resulting static read current flows on the respective bit lines. The magnitude of the static read current that occurs represents the logic levels of the memory occupancy.

It can be seen from this that two bit lines (for drain and source) are necessary in the case of the prior art for the read-out of the memory occupancy of the UCP flash memory cells. This cell is, therefore, limited in terms of its minimum dimensions to twice the metal spacing in the direction of the word line.

In order to minimize this restriction of the memory space utilization, the current UCP concepts use exhausted metal design rules in the design and production of small cell sizes.

In addition, the critical situation in the design of the cell is increased if the required contact-connections are realized in order to apply the necessary potentials to the two bit lines.

All this subjects the UCP concept to a competitive disadvantage in comparison with other concepts in the case of very large memories.

Therefore, major endeavors are characterized by aiming to obviate bit lines. Thus, D. Shum et al., in U.S. Pat. No. 6,327,182, which is incorporated herein by reference, have proposed placing the metal layers used for the bit lines one above the other.

However, this method is unsuitable for reducing the cell size since the design rules (DR) for the stacked vias demonstrated there necessitate substantially narrower tolerances than the DR for metal layers lying one next to the other.

Owing to the associated lower yield that is to be expected in this case, this makes it rather unlikely that the space saving would be successful.

SUMMARY OF THE INVENTION

In various embodiments, the invention relates to a method for the read-out of UCP (Uniform Channel Program) flash memory cells. Local bit lines are selected by means of a respective select signal on a respective sector select line by virtue of the respective local bit line switching to a respective global bit line via a respective sector select selection transistor, which is connected to the sector select line by its gate.

In one aspect, the invention increases the storage density by reducing the cell size through alterations to the structure of the memory cell, which also includes fundamentally different read methods than the customary read current method for determining the memory occupancy.

In a preferred embodiment, the invention includes, in the case of the selected local bit lines, a memory cell transistor that is driven by a respective read potential at its gate via a word line and is read in a read-out operation described below.

Thus, the respective memory cell transistor is associated with a bit column, which comprises memory cell transistors respectively connected in parallel by their pairs, by their drain and source terminals. In this case, on the one hand, the drain terminals of the memory cell transistors are connected via the local bit line. On the other hand, their source terminals are not at a fixed potential.

During the read-out operation, a capacitive loading of the local bit line dependent on the magnitude of the charge stored on the floating gate of the driven memory cell transistor is generated.

In this case, a resulting read-out signal is provided on the local bit line depending on the magnitude of the aforementioned capacitive loading of the local bit line, which read-out signal is assessed by a read block connected to the local bit line as a LOW or HIGH level—to be output in valid fashion—of a bit signal.

The bit signal corresponds to the bit occupancy of the memory cell transistor, which is represented by the magnitude of the charge stored on the floating gate.

This solution is directed at the fact that, in the case of an alteration of the structure of the memory cell, for the purpose of reducing the cell size, a fundamentally different read method is also employed and, consequently, the memory occupancy of the memory transistors is read using capacitive means. In this case, the source potential of the memory transistor that is respectively to be read has a floating potential.

This avoids the need for a fixed potential at the source terminal and thus the need to provide in each case a metallic source line (as read line), or this avoids also having to implement contact-connections that are costly, in respect of area, when such a source line is embodied as a buried line.

By virtue of the capacitive read-out predominantly of the respective source-ground capacitance, the associated potential at the respective source terminal of the memory transistor may be floating. Since this solution does not involve evaluating a continuously flowing read current, the capacitance measurement additionally saves energy.

Thus, with this energy-saving effect, this capacitance measuring method for determining the bit occupancy of the memory transistor is additionally appropriate in applications of low power-circuits.

Consequently, it is possible to realize read operations that expend very little energy since only a capacitive load needs to be driven in a transient manner when reading the memory occupancy of a respective memory transistor.

This means that, in the case of the HIGH occupancy (the memory transistor is turned on, that is to say the channel between drain and source is formed), the parasitic drain/ground, channel/ground and the source/ground capacitance, otherwise only the drain/ground capacitance, is to be regarded as the load to be driven in a transient manner.

Furthermore, the UCP cell size that can be achieved with this method is on a par in terms of its performance with peak values of other cell structures.

It is expedient that the customary programming and erasing methods can be used in the case of such a UCP cell.

The parallel application of conventional and UCP cells with the solution according to embodiments of the invention can also be realized in the same chip.

In the design of memory circuits of UCP cells of the solution according to the invention, different, inherently mutually conflicting application requirements, e.g., read speed verses storage density, can be interchanged and coordinated well. Especially these application requirements are both supported effectively by a uniform architecture.

One embodiment of the solution according to the invention is achieved in that, during the read-out operation, the respective read potential of the word line is varied in a number of discrete steps.

For each discrete step of the read potential, such a read-out signal established in a resultant manner and having likewise different discrete levels is determined.

Afterward, the totality of the discrete levels of the read signal is assessed, by means of suitable coding, by the read block connected to the local bit line as LOW or HIGH levels—to be output in valid fashion—of a multiple bit signal that corresponds to the multiple bit occupancy of the memory cell transistor.

In this case, the multiple bit occupancy is represented by the magnitude of the charge stored on the floating gate.

The multilevel values of the measured capacitive loading for each memory transistor may either contribute directly as multiple bit occupancy to increasing the storage capacity, or, by means of corresponding coding evaluation, they may provide the assessed HIGH/LOW level assignment with a high interference immunity in that identified levels that cannot be assigned unambiguously to HIGH/LOW levels and are thus associated with a "forbidden zone" of the binary value assignment are verified (e.g., by renewed reading of the memory occupancy, etc.).

One variant of the embodiment of the solution according to the invention is achieved by virtue of the fact that a first and second memory cell transistor pair, which are associated with the bit column and the transistors of which are in each case connected in parallel in pairs at the drain and source terminals, are connected by their respective common source terminals to a common source terminal connection.

In this case, the common source terminal connection is likewise not connected to a fixed potential.

Furthermore, the first and second source-ground capacitances respectively associated with the first and second memory cell transistor pairs are connected in parallel with the common source terminal connection.

In the case of this solution, the non-selected memory transistors are connected in parallel by their source/ground capacitances with the source/ground capacitance of the selected memory transistor. This increases the total capacitance of the capacitive loading of the bit line during the respective reading of the bit occupancy of the selected memory transistor.

A preferably better read-out of the bit occupancy of the selected memory transistor can be achieved by means of differential reading in the case of this inventive solution. In this case, a reference bit line is used in order to mask out common-mode interference.

In this case, an arbitrary selected bit line from the memory can be used as a reference bit line and an associated memory cell whose channel is closed is selected. In this way, what is present as reference is a memory cell in the case of which the capacitive loading of the bit line with the channel not formed is known and can be used for comparison in the differential measurement.

A further embodiment of the solution according to the invention is achieved by virtue of the fact that the common source terminal connection is embodied as a buried bit line without external connection.

BRIEF DESCRIPTION OF THE DRAWINGS

For a more complete understanding of the present invention, and the advantages thereof, reference is now made to the following descriptions taken in conjunction with the accompanying drawings.

Figure 1:
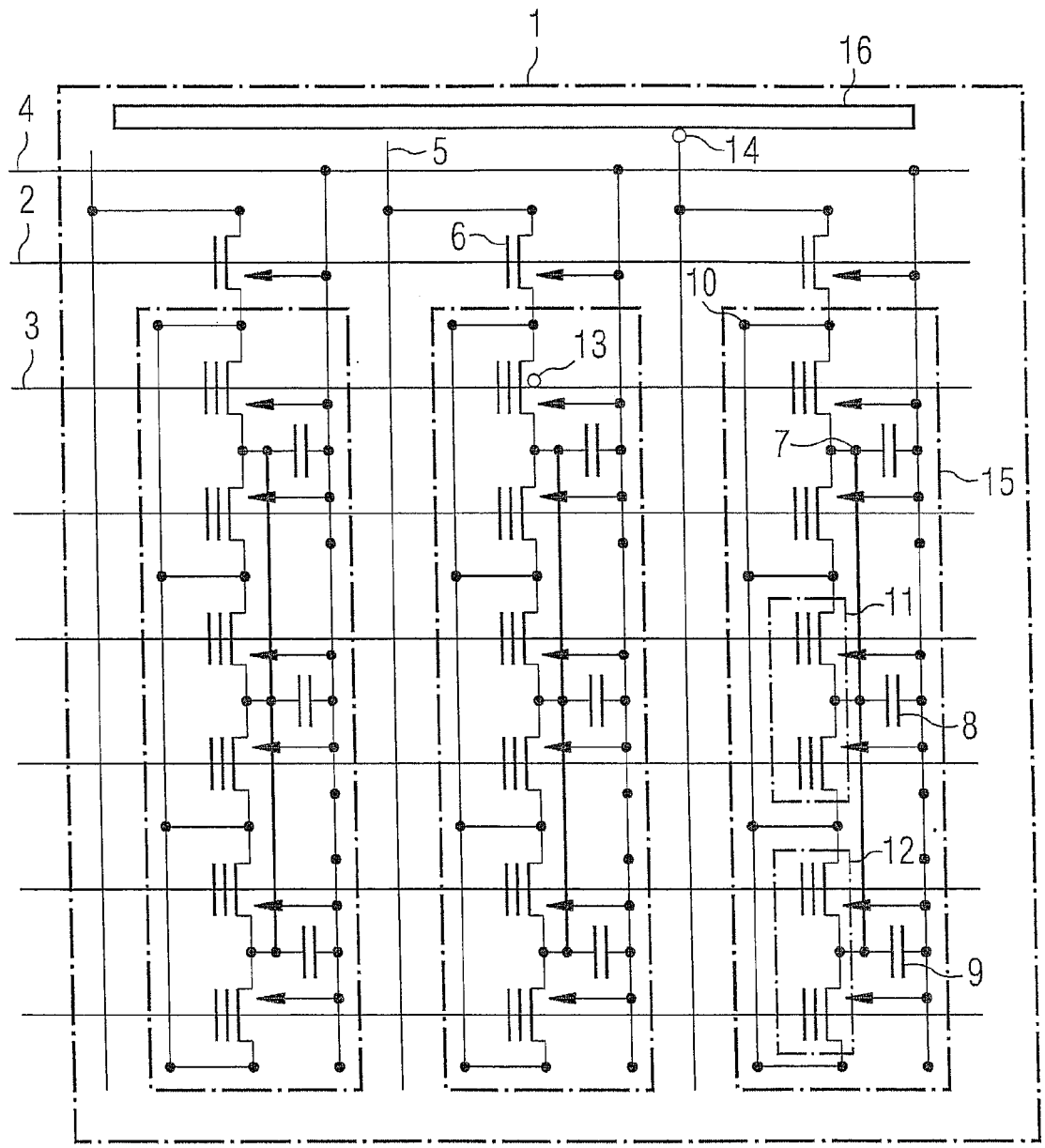
FIG. 1 is a schematic diagram of an exemplary memory device that utilizes embodiments of the invention.

The following list of reference symbols can be used in conjunction with FIG. 1:
1 UCP flash memory
2 Sector select line (connection of the global bit line to the local bit line)
3 Word line
4 Ground line (bulk potential)
5 Global bit line
6 Sector select selection transistor
7 Common source terminal connection
8 First source-ground capacitance
9 Second source-ground capacitance
10 Local bit line (common drain terminal line of the memory cell transistors of a bit column)
11 First memory cell transistor pair
12 Second memory cell transistor pair
13 Read potential
14 Read-out signal
15 Bit column
16 Read block

DETAILED DESCRIPTION OF ILLUSTRATIVE EMBODIMENTS

The invention will be explained in more detail below on the basis of an exemplary embodiment. FIG. 1 shows a memory area of a UCP flash memory 1.

During read-out, a local bit line 10 is selected by means of a respective select signal on a respective sector select line 2. The respective local bit line 10 is switched to a respective global bit line 5 via a respective sector select selection transistor 6 connected to the sector select line 2 by its gate.

A first memory cell transistor pair 11 and a second memory cell transistor pair 12 are associated with a bit column 15. The pairs comprise memory cell transistors that are respectively connected in parallel in pairs by their drain and source terminals, their drain terminals being connected via the local bit line 10 and their source terminals not being at a fixed potential.

If, in the case of the selected local bit lines 10, the memory cell transistor is driven by a respective read potential 13 at its gate via a word line 3, a read-out operation is realized by a procedure in which a capacitive loading of the local bit line 10 dependent on the magnitude of the charge stored on the floating gate of the driven memory cell transistor is generated.

Depending on the magnitude of the capacitive loading of the local bit line 10, a resulting read-out signal 14 is provided on the local bit line, which read-out signal is assessed by a read block 16 connected to the local bit line 10 as LOW or HIGH level—to be output in valid fashion—of a bit signal.

This bit signal corresponds to the bit occupancy HIGH/LOW of the memory cell transistor, which is represented by the magnitude of the HIGH/LOW charge stored on the floating gate.

At the applied read voltage, a channel is or is not formed, depending on the stored charge on the floating gate. In the former case, such a capacitance can be measured, which is essentially formed from a drain/ground capacitance (not illustrated any further), channel/ground capacitance and a first or second source/ground capacitance 8, 9. If a channel is not formed, only the drain/ground capacitance can be measured.

This read method according to this embodiment of the invention preferably involves evaluating voltages, but on no account static currents.

In an exemplary embodiment of the read method, the selected memory cell transistor is opened with a high read voltage and the local bit line 10 is brought to a first potential.

Afterward, the read voltage is returned to zero and then the local bit line 10 is brought to a second potential and then switched to high impedance.

The actual read voltage is applied and the voltage swing on the local bit line 10 is measured. Since only the voltage swing is measured and the drain/ground capacitance is continuously effective as capacitive loading of the local bit line 10, only the effect of the first or second source/ground capacitance 8, 9 is thus measured.

The read-out levels are decoded in the read block 16, a large voltage swing identifying an opened channel as HIGH and a small voltage swing identifying a closed channel as LOW.

Consequently, the LOW or HIGH levels—to be output in valid fashion—of a bit signal are assessed by the connected read block 16. These LOW or HIGH levels correspond to the bit occupancy of the memory cell transistor, which is represented by the magnitude of the charge stored on the floating gate.

Figure 2:
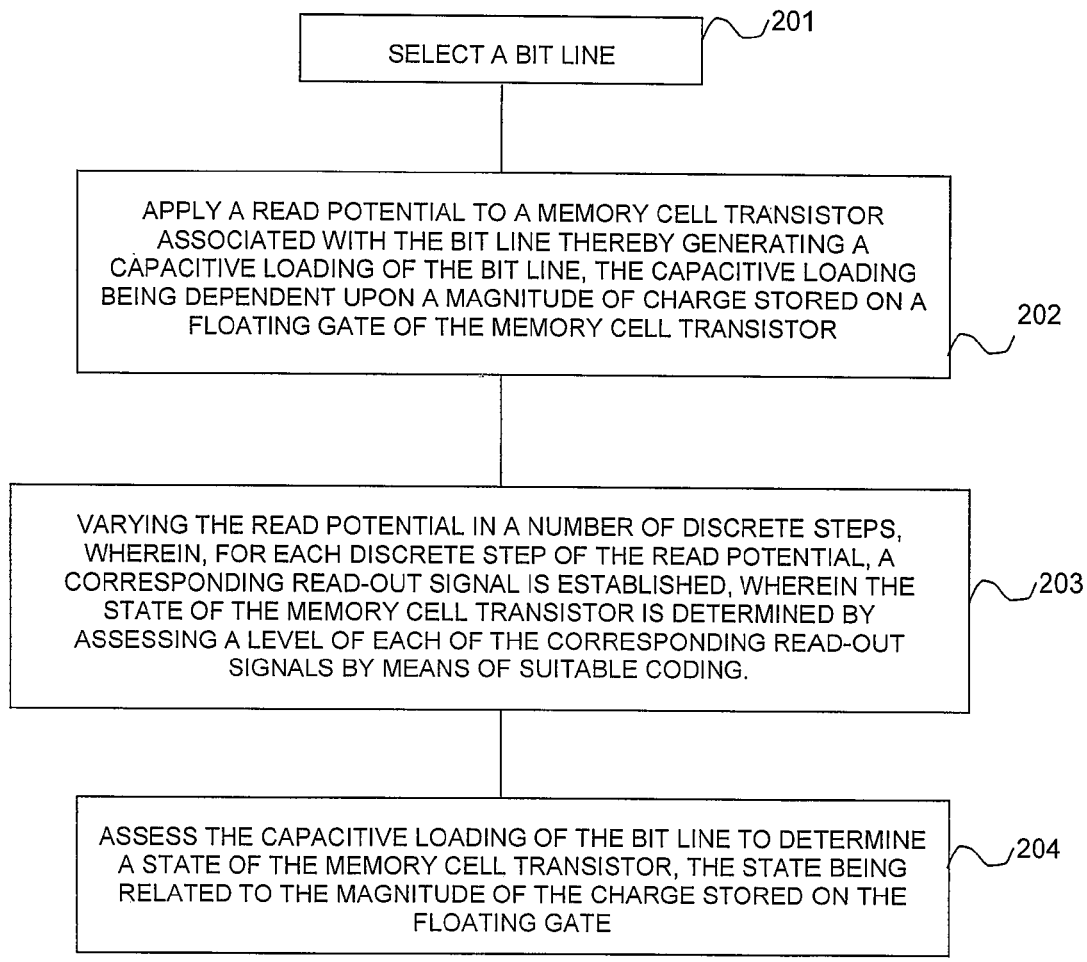
FIG. 2 is a flow chart illustrating an exemplary method for reading a memory device utilizing embodiments of the invention.

FIG. 2 is flow chart illustrating an exemplary method for reading a memory device utilizing embodiments of the invention. In step 201, a bit line is selected. In one embodiment, the bit line is selected by causing a local bit line to be switched to a global bit line. In an alternative embodiment, a local bit line may be selected by applying a select signal to a selection transistor coupled between the local bit line and the global bit line.

In step 202, a read potential is applied to a memory cell transistor associated with the bit line thereby generating a capacitive loading of the bit line, the capacitive loading is dependent upon a magnitude of charge stored on a floating gate of the memory cell transistor. In one embodiment, the read potential is applied to the memory cell transistor by applying the read potential to a gate of the memory cell transistor via a word line. In an alternative embodiment, the read potential applied to a memory cell transistor is varied in a number of discrete steps. In step 203, the read potential is varied in a number of discrete steps, wherein, for each discrete step of the read potential, a corresponding read-out signal is established, wherein the state of the memory cell transistor is determined by assessing a level of each of the corresponding read-out signals by means of suitable coding.

In step 204, the capacitive loading of the bit line is assessed to determine a state of the memory cell transistor, the state is related to the magnitude of the charge stored on a floating gate. In one embodiment, the state of the memory cell transistor may be determined by providing a read-out signal on the bit line, which depends on a magnitude of the capacitive loading of the bit line, and assessing the read-out signal to determine a state of the memory cell transistor. The read-out signal may be assessed by a read block coupled to the bit line.

What is claimed is:

1. A method for reading a flash memory cell, the method comprising:
    selecting a bit line;
    applying a read potential to a memory cell transistor associated with the bit line thereby generating a capacitive loading of the bit line, the capacitive loading being dependent upon a magnitude of charge stored on a floating gate of the memory cell transistor, wherein the memory cell transistor is one of a pair of memory cell transistors coupled in parallel by source and drain terminals, the drain terminals being coupled via the bit line and the gates of the pair of memory cell transistors being coupled to separate words lines; and
    assessing the capacitive loading of the bit line to determine a state of the memory cell transistor, the state being related to the magnitude of the charge stored on the floating gate.

2. The method as claimed in claim 1, wherein reading out the memory cell transistor comprises reading out a uniform channel program memory cell.

3. The method as claimed in claim 1, wherein the state of the memory cell transistor is determined by:
    providing a read-out signal on the bit line, the read out signal depending on a magnitude of the capacitive loading of the bit line; and
    assessing the read-out signal to determine a state of the memory cell transistor, the read-out signal being assessed by a read block coupled to the bit line.

4. The method as claimed in claim 1, wherein applying a read potential to the memory cell transistor comprises applying the read potential to a gate of the memory cell transistor, the read potential being applied via a word line.

5. The method as claimed in claim 1, wherein the memory cell transistor is associated with a bit column that includes a plurality of memory cell transistors coupled in parallel in pairs by source and drain terminals, the drain terminals being coupled via the bit line and the source terminals not being at a fixed potential.

6. The method as claimed in claim 1, wherein selecting a bit line comprises causing a local bit line to be switched to a global bit line.

7. The method as claimed in claim 6, wherein selecting a local bit line comprises applying a select signal to a selection transistor coupled between the local bit line and the global bit line.

8. The method as claimed in claim 7, wherein the selection transistor includes a gate that is coupled to a sector select line.

9. The method as claimed in claim 1, wherein applying a read potential to a memory cell transistor comprises applying a read potential that is varied in a number of discrete steps.

10. The method as claimed in claim 9, wherein, for each discrete step of the read potential, a corresponding read-out signal is established, wherein the state of the memory cell transistor is determined by assessing a level of each of the corresponding read-out signals by means of suitable coding.

11. The method as claimed in claim 1, wherein the memory cell transistor comprises a transistor of a first memory cell transistor pair in a bit column that also includes a second memory cell transistor pair coupled in parallel with the first memory cell transistor pair, wherein transistors of each memory cell transistor pair include a common source terminal connection, the common source terminal not being coupled to a fixed potential when the capacitive loading is being assessed.

12. The method as claimed in claim 11, wherein first and second source-ground capacitances respectively associated with the first and second memory cell transistor pairs are coupled in parallel with the common source terminal connection.

13. The method as claimed in claim 11, wherein the common source terminal connection is embodied as a buried bit line without external connection.

* * * * *

UNITED STATES PATENT AND TRADEMARK OFFICE
CERTIFICATE OF CORRECTION

PATENT NO. : 7,317,631 B2
APPLICATION NO. : 11/213670
DATED : January 8, 2008
INVENTOR(S) : Gratz et al.

It is certified that error appears in the above-identified patent and that said Letters Patent is hereby corrected as shown below:

Col. 3, line 40, delete "verses" and insert --versus--.
Col. 6, line 4, after "is" insert --a--.
Col. 6, line 66, delete "a" and insert --the--.
Col. 7, line 19, delete "a" and insert --the--.
Col. 7, line 20, delete "a" and insert --the--.
Col. 8, line 11, before "not" insert --connection--.

Signed and Sealed this

Sixth Day of May, 2008

JON W. DUDAS
*Director of the United States Patent and Trademark Office*